United States Patent [19]

Ikeno

[11] 4,420,652
[45] Dec. 13, 1983

[54] HERMETICALLY SEALED PACKAGE

[75] Inventor: Hitoshi Ikeno, Tokyo, Japan

[73] Assignee: Seikosha Co., Ltd., Tokyo, Japan

[21] Appl. No.: 297,411

[22] Filed: Aug. 28, 1981

[30] Foreign Application Priority Data

Sep. 2, 1980 [JP] Japan ................................ 55-121624

[51] Int. Cl.$^3$ .............................................. H05K 5/06
[52] U.S. Cl. .................................. 174/52 H; 310/348;
361/395; 361/399
[58] Field of Search .............. 174/52 S, 52 H; 357/74;
361/392, 395, 399; 310/348; 339/17 R, 17 C, 17 CF

[56] References Cited

U.S. PATENT DOCUMENTS 3,339,117 8/1967 Fisher ........................... 339/17 C X
3,828,210 8/1974 Livenick et al. ............. 174/52 H X Primary Examiner—A. T. Grimley
Assistant Examiner—D. A. Tone
Attorney, Agent, or Firm—Robert E. Burns; Emmanuel J. Lobato; Bruce L. Adams

[57] ABSTRACT

A shell of a hermetically sealed package has a through hole and a circuit board is inserted and fixed hermetically into the through hole, and a can is fixed hermetically to the shell. The circuit board consists of a sealed part which is sealed hermetically by the hermetically sealed package, a fixed part to which the shell is fixed, and a projecting part which projects out from the hermetically sealed package. As the circuit pattern extends from the sealed part through the fixed part to the projecting part, it is not necessary to use terminal pins and instead a large number of external lead electrodes are taken out from the hermetically sealed package.

An integrated-circuit chip or the like which is sealed by the hermetically sealed package can be shielded from electromagnetic influence by the metallic shell and the metallic can.

2 Claims, 12 Drawing Figures

HERMETICALLY SEALED PACKAGE

BACKGROUND OF THE INVENTION

The present invention relates to a hermetically sealed package in which an integrated-circuit chip or the like is sealed.

There are "TO-5" or "TO-8" type hermetically sealed packages, as embodiments of conventional hermetically sealed packages. This package consists of a hermetically sealed base which fixes many terminal pins to a metallic shell by hermetic glass, and a metallic can which is fixed hermetically to the hermetically sealed base by the method of resistance welding, cold welding or soldering. This package has the merit that the hermetic seal is strong and complete, but this package has the demerits that it is expensive and there is a limit as to the number of terminal pins.

There are many other types of hermetically sealed packages, but these packages have demerits that the production of these packages is complex, and these packages are expensive. Additionally these packages have the problem of a leakage since the hermetic seals of these packages are not strong and complete.

SUMMARY OF THE INVENTION

It is accordingly an object of the present invention to provide a circuit board which is formed with a circuit pattern on at least one surface and which projects out from a shell of a hermetically sealed package.

It is a further object of the present invention to provide a hermetically sealed package which need not use terminal pins, and from which a large number of external lead electrodes are taken out.

It is another object of the present invention to provide a hermetically sealed package whose hermetic seal is strong and complete, and which is not susceptible to leakage.

It is still another object of the present invention to provide a hermetically sealed package which can be produced at a low cost.

BRIEF DESCRIPTION OF THE DRAWINGS

In the drawings, the figures illustrate one embodiment of a quartz oscillator utilizing a hermetically sealed package of this invention.

DETAILED DESCRIPTION OF THE INVENTION

Figure 1:
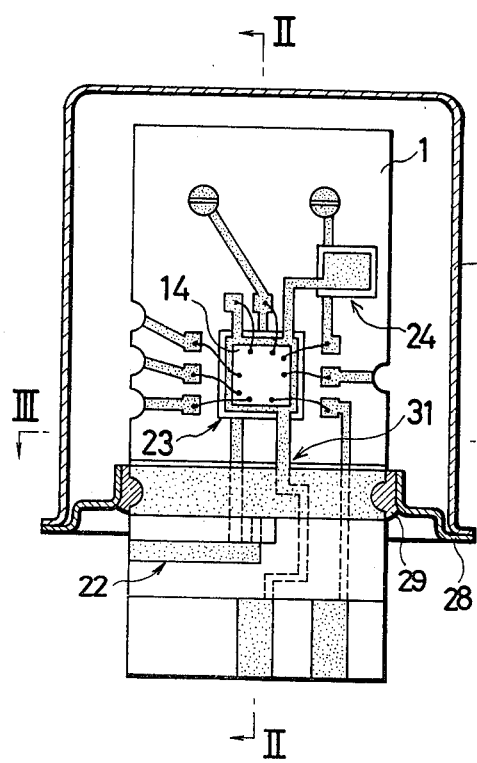
FIG. 1 is an elevational view partly in section.
Figure 2:
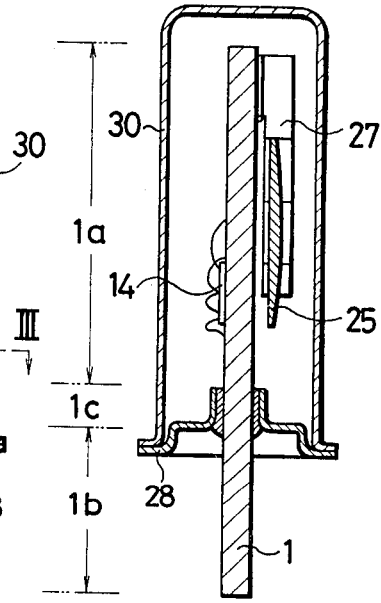
FIG. 2 is a sectional view taken along the line II—II of FIG. 1.
Figure 3:
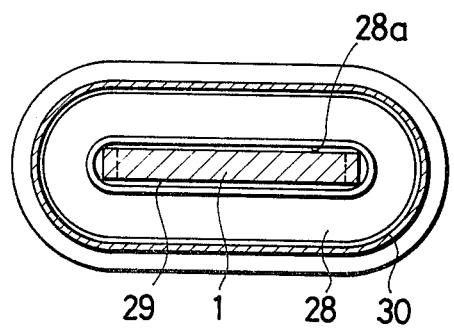
FIG. 3 is a sectional view taken along the line III—III of FIG. 1.

An embodiment of a quartz oscillator utilizing a hermetically sealed package of the present invention is described below with reference to the drawings.

Referring to FIGS. 1–3 and FIG. 5, a circuit board 1 made of ceramics or the like, has one end in the form of a sealed part 1a which is sealed hermetically to define a hermetically sealed package, another end in the form of a projecting part 1b which projects out from the hermetically sealed package, and a middle part in the form of a fixed part 1c to which is fixed a shell of the hermetically sealed package.

The formation of a circuit pattern 2, capacitors and other electronic components on the circuit board 1 will be described with reference to FIGS. 6–12.

The formation of a circuit pattern 2 on a front surface of the circuit board 1 will be described with reference to FIGS. 9–12.

Figure 9:
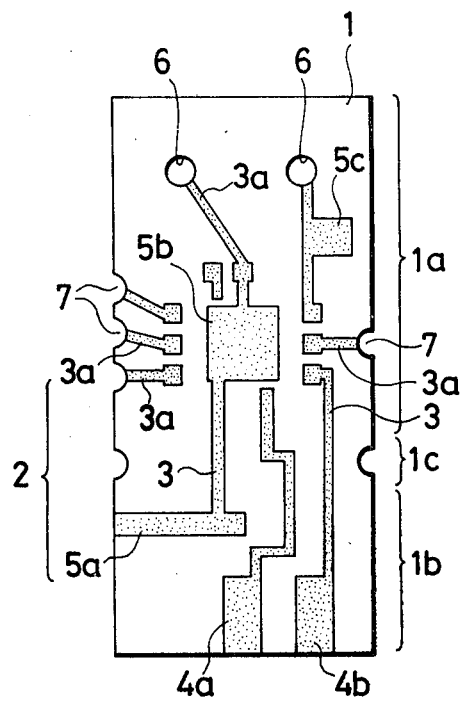
FIG. 9 is an elevational view of a circuit board showing a circuit pattern on a front surface.
Figure 10:
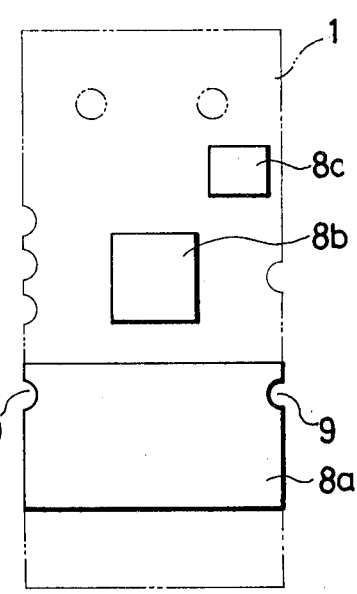
FIG. 10 is an elevational view of insulating films on a front surface.
Figure 11:
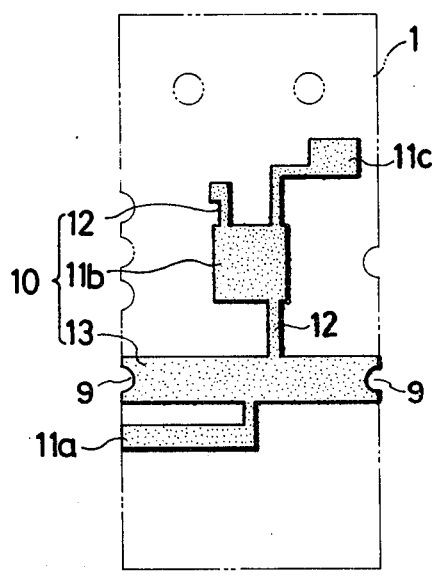
FIG. 11 is an elevational view of an upper conductive film comprising a metallized film on a front surface.
Figure 12:
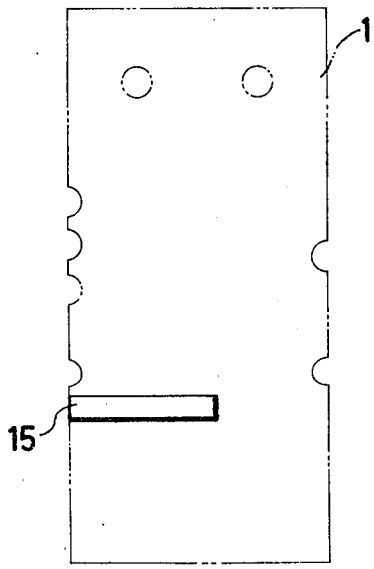
FIG. 12 is an elevational view of an upper insulating film on a front surface.

As stated above, the circuit board 1 comprises a sealed part 1a, a fixed part 1c and a projecting part 1b, and a circuit pattern 2 is formed on the front surface of the circuit board 1 as illustrated in FIG. 9. This circuit pattern comprises wirings 3---, two external lead electrodes 4a, 4b and three electrodes 5a, 5b, 5c of three capacitors. The circuit pattern 2 is made of a conductive paste by silk-screening or other suitable method, then fixed or fired at an appropriate temperature to provide a hard conductive surface or joint. The conductive paste is made of a powder of tungsten or the like in a suitable vehicle. Two perforations 6, 6 and four cuttings 7--- are made on the circuit board 1. The wirings 3a--- connecting these perforations and cuttings can be connected to a circuit pattern of a rear surface of the circuit board because the conductive paste of the wirings 3a are formed at the edge plane of the perforations and cuttings by silk-screening. The circuit pattern 2 extends from the sealed part 1a through the fixed part 1c to the projecting part 1b. After formation of the circuit pattern 2 shown in FIG. 9, three insulating films 8a, 8b, 8c shown in FIG. 10 are formed on the circuit pattern 2. These insulating films are made of an insulating paste by silk-screening or other suitable method, then fixed or fired. The insulating paste is made of powder of alumina or the like in a suitable vehicle. The insulating film 8a is formed on the circuit pattern 2 to correspond with the fixed part 1c of the circuit board 1 and with the electrode 5a of one capacitor, and the width of the insulating film 8a is larger than the width of the fixed part 1c. The insulating films 8b, 8c correspond with the electrodes 5b, 5c of the other capacitors, and are formed a little larger than the electrodes 5b, 5c. The insulating film 8a is formed by silk-screening at the edge plane of the circuit board 1 for the cuttings 9, 9 which is made to correspond with the fixed part 1c. On these insulating films, an upper conductive film 10 shown in FIG. 11 is formed. This upper conductive film comprises electrodes 11a, 11b, 11c, wirings 12---, and a metallized film 13, and is made of a conductive paste by silk-screening, then fixed or fired in the same manner as the aforementioned circuit pattern 2. The metallized film 13 corresponds with the fixed part 1c of the circuit board 1, and is formed to the edge plane of the circuit board 1 for the cuttings 9, 9. The electrode 11b is used both for a capacitor and for a die-bonding of an integrated-circuit chip 14. If the thin-film capacitors are not necessary on the circuit board, the electrodes 5a, 5b, 5c, 11a, 11b, 11c and the insulating films 8b, 8c are not necessary, and the width of the insulating film 8a can be of a width a little larger than the fixed part 1c. A upper insulating film 15 illustrated in FIG. 12 is formed on the upper conductive film 10. This upper insulating film is made of a alumina paste by silk-screening, then fired or fixed. The upper insulating film 15 prevents a fixing material, such as a solder, to flow along the wirings when a shell as described later is fixed to the metallized film 13.

Figure 6:
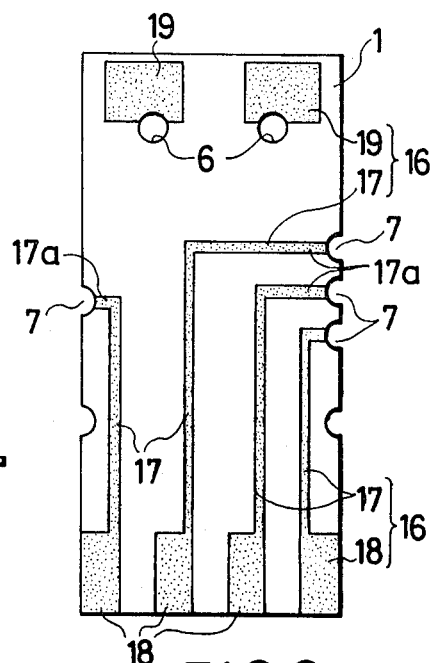
FIG. 6 is a rear elevational view of a circuit board showing a circuit pattern on a rear surface.
Figure 7:
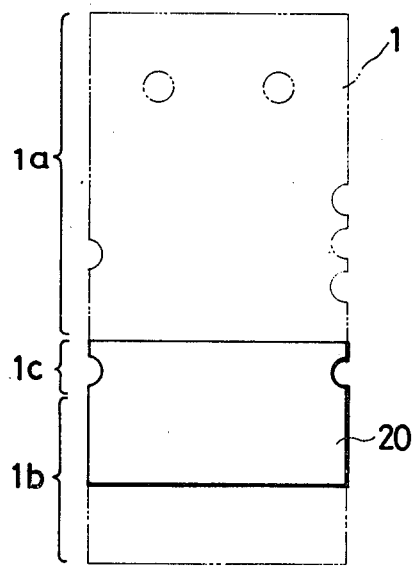
FIG. 7 is an elevational view of an insulating film on a rear surface.
Figure 8:
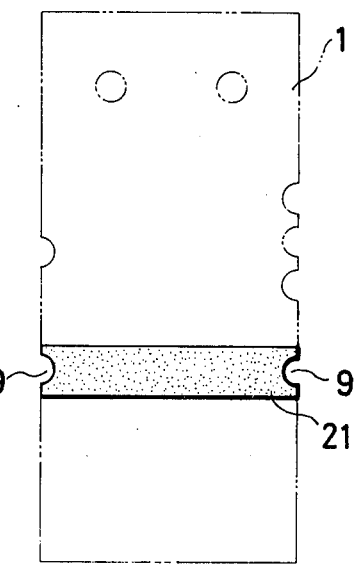
FIG. 8 is an elevational view of a metallized film on a rear surface.

Next reference will be made to the formation of the circuit pattern on a rear surface of the circuit board 1 with reference to FIGS. 6–8. A circuit pattern 16 illustrated in FIG. 6 is formed on a rear surface of the circuit board 1. The circuit pattern 16 comprises wirings 17---, four lead electrodes 18---, and two independent electrodes 19, 19. This circuit pattern is made of conductive paste in the same manner as the circuit pattern 2. The independent electrodes 19, 19 and wirings 17a--- are formed to the edge plane of the circuit board 1 via the perforations 6, 6 and the cuttings 7---, and in this manner the wirings 17a--- connect to the wirings 3a--- of the front surface. An insulating film 20, illustrated in FIG. 7, is made of the alumina paste and is formed on the circuit pattern 16 by silk-screening. The insulating film 20 is formed to correspond with the fixed part 1c. The width of the insulating film 20 is equal to the width of the insulating film 8a on the front surface, but the width of the insulating film 20 can be of a width a little larger than the fixed part 1c. If the insulating films on both surfaces are the same width, a bending of the circuit board at firing can be small. A metallized film 21 illustrated in FIG. 8, made of conductive paste, is formed on the insulating film 20 by silk-screening. The metallized film 21 is formed to an edge plane of the circuit board 1 for the cuttings 9, 9 when the metallized film is formed by silk-screening. In this manner, the metallized film 21 connects to the metallized film 13 on the front surface, and the metallized films are formed around the circuit board to correspond with the fixed part 1c. As the width of the metallized film 21 is equal to the width of the metallized film 13, a bending of the circuit board at firing is effectively prevented.

If the circuit pattern 16 is not necessary on the rear surface and only the circuit pattern 2 is formed on the front surface, on the rear surface it is necessary that the metallized film 21 be connected to the metallized film 13 on the front surface.

This circuit board 1, on the front surface of which are formed the circuit pattern 2, the insulating films 8a, 8b, 8c, the upper conductive film 10 and the insulating film 15 and on the rear surface of which are formed the circuit pattern 16, the insulating film 20 and the metallized film 21, is completed by firing in a hearth. In this embodiment the conductive part of the circuit patterns and the metallized films are plated with nickel.

Figure 4:
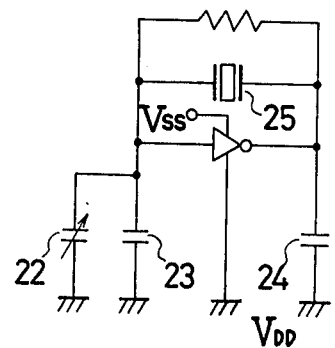
FIG. 4 is a circuit diagram of a quartz oscillator.
Figure 5:
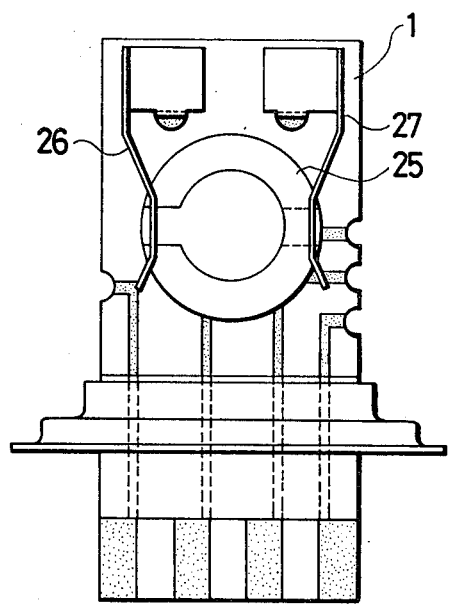
FIG. 5 is a rear elevational view omitting a can.

As shown in FIGS. 1–5, an integrated-circuit chip 14 is bonded by conductive paste on the capacitor's electrode 11b which is used for die-bonding and pads of the integrated-circuit chip 14 and the lands of the circuit pattern 2 are wired by wire-bonding. On the circuit board 1, three thin-film capacitor 22, 23, 24 are formed such that the capacitor 22 consists of the electrodes 5a, 11a and the insulating film 8a which is between these electrodes, the capacitor 23 consists of the electrodes 5b, 11b and the insulating film 8b which is between these electrodes, and the capacitor 24 consists of the electrodes 5c, 11c and the insulating film 8c which is between these electrodes. On the rear surface of the circuit board 1, a quartz vibrator 25 is supported by two supporting members 26, 27. The supporting members 26, 27 are fixed to the independent electrodes 19, 19. The above mentioned capacitors and quartz vibrator are connected as shown in FIG. 4. The external lead electrodes 4a and 4b are the respective $V_{DD}$ terminals and $V_{SS}$ terminal and the external lead electrodes 18--- on the rear surface are output terminals, reset terminal and the like. A shell 2b has a through hole 28a at its center and a fixing material 29 is filled up between the through hole 28a and the fixed part 1c of the circuit board 1. In this embodiment the shell 28 is made of a metal such as copper, Kovar(trademark) or the like, the fixing material 29 is a solder or a brazing material, and the shell 28 and the circuit board 1 are fixed hermetically by soldering or brazing. As the metallized films 13, 21 which are formed at the fixed part 1c are formed at the edge plane of the circuit board 1, and are formed around the circuit board 1, the shell 28 and the circuit board 1 are fixed hermetically by the fixing material 29 around the circuit board 1 and consequently the hermetic seal is strong and complete. The fixing material 29 fills up the space between the rising of the through hole 28a of the shell 28 and the circuit board 1, and fills up the space around the circuit board 1. Besides, as the height of the shell rising of the through hole is big, and the width of the fixed part is big, the hermetic seal between the shell and the circuit board is strong and complete. A can 30 covers the sealed part 1a, and is fixed to the flange of the shell 28. In this embodiment, the can 30 is also made of a metal such as copper or Kovar, and the can 30 and the shell 28 are fixed hermetically by the method of resistance welding, cold welding or soldering to form a strong hermetic seal. The sealed part 1a of the circuit board 1 is shielded electromagnetically by the hermetically sealed package since the metallized films 13, 21 of the fixed part 1c of the circuit board 1 are connected to the $V_{DD}$ terminal 4a at the contact point 31, and the voltage of the shell 28 and the can 30 is earthed or grounded.

In this embodiment, the fixing material 29 comprises a conductive fixing material such as a solder or a brazing material, but a non-conductive material such as a low melting glass can also be used. In such a case, it is possible that the metallized films 13, 21 and the insulating films 8a, 20 need not be formed on the circuit board 1. If the voltage of the metallic can and the metallic shell is earthed in case of using a non-conductive fixing material, the $V_{DD}$ terminal 4a and the shell 28 can be connected by a lead wire.

The projecting part 1b of the circuit board 1 can be inserted into a connector which is not shown, and the lead wires can be soldered to the external lead electrodes of the projecting part 1b.

The frequency of the quartz oscillator is adjusted by trimming of the capacitor 22. Trimming of the capacitor is accomplished by selectively removing the upper conductive film by a sand blast or laser beam technique to reduce the capacitance.

According to the present invention, the hermetically sealed package need not employ terminal pins, is simple in construction, and can be produced at low cost since a portion of the circuit board projects from the hermetically sealed package. By such a construction many external lead electrodes can be taken out from the hermetically sealed package, and even more external lead electrodes can be taken from the hermetically sealed package if circuit patterns are formed on both surfaces of the circuit board. Furthermore, the hermetic seal between the circuit board and the shell, and between the shell and the can, are strong and complete, so that leakage of the hermetically sealed package is hardly likely.

In using a case of the metallic shell and metallic can, the hermetic seal of this shell and this can may be formed by resistance welding cold welding or soldering and such a seal is very reliable. Moreover, if the voltage of this shell and this can is earthed, the integrated-circuit chip or the like in the hermetically sealed package is shielded electromagnetically, and is hardly influenced by stray capacitance.

What we claim is:

1. A hermetically sealed package comprising: a shell having a through hole; a circuit board consisting of a sealed part, a fixed part and a projecting part, and having a circuit pattern extending from said sealed part through said fixed part to said projecting part on at least one surface thereof, and being inserted into said through hole; a non-conductive fixing material fixing hermetically said fixed part of said circuit board into said through hole of said shell; and a can fixed hermetically to said shell, and sealing said sealed part of said circuit board together with said shell.

2. A hermetically sealed package comprising: a metallic shell having a through hole; a circuit board consisting of a sealed part, a fixed part and a projecting part, and having a circuit pattern extending from said sealed part through said fixed part to said projecting part on at least one surface thereof, and being inserted into said through hole; at least one insulating film whose width is larger than the width of said fixed part and formed on said circuit pattern to correspond with said fixed part; metallized films formed on said insulating film or on said fixed part, and formed around said circuit board; a conductive fixing material fixing hermetically said metallized films on said fixed part of said circuit board into said through hole of said metallic shell; and a metallic can fixed hermetically to said metallic shell, and sealing said sealed part together with said metallic shell.

* * * * *